United States Patent
Rao et al.

(10) Patent No.: US 7,241,479 B2
(45) Date of Patent: Jul. 10, 2007

(54) THERMAL CVD SYNTHESIS OF NANOSTRUCTURES

(75) Inventors: Apparao M. Rao, Anderson, SC (US); Rahul Rao, Clemson, SC (US)

(73) Assignee: Clemson University, Anderson, SC (US)

( * ) Notice: Subject to any disclaimer, the term of this patent is extended or adjusted under 35 U.S.C. 154(b) by 256 days.

(21) Appl. No.: 10/646,360

(22) Filed: Aug. 22, 2003

(65) Prior Publication Data
US 2005/0042465 A1 Feb. 24, 2005

(51) Int. Cl.
*C23C 16/00* (2006.01)
*B05D 1/18* (2006.01)

(52) U.S. Cl. .............. 427/443.1; 427/248.1; 427/255.28; 427/255.31; 427/255.32

(58) Field of Classification Search ......... 427/248.1, 427/255.28, 255.31, 255.32
See application file for complete search history.

(56) References Cited

U.S. PATENT DOCUMENTS

| | | | |
|---|---|---|---|
| 6,123,819 A | 9/2000 | Peeters | |
| 6,129,901 A | 10/2000 | Moskovits et al. | |
| 6,159,856 A | 12/2000 | Nagano | |
| 6,232,706 B1 | 5/2001 | Dai et al. | |
| 6,248,674 B1 | 6/2001 | Kamins et al. | |
| 6,286,226 B1 | 9/2001 | Jin | |
| 6,294,450 B1 | 9/2001 | Chen et al. | |
| 6,297,063 B1 | 10/2001 | Brown et al. | |
| 6,325,909 B1 | 12/2001 | Li et al. | |
| 6,340,822 B1 | 1/2002 | Brown et al. | |
| 6,346,303 B1 | 2/2002 | Shih et al. | |
| 6,383,923 B1 | 5/2002 | Brown et al. | |
| 6,407,443 B2 | 6/2002 | Chen et al. | |
| 6,458,621 B1 | 10/2002 | Beck | |
| 6,465,132 B1 | 10/2002 | Jin | |
| 6,469,425 B1 | 10/2002 | Sakai et al. | |
| 6,472,802 B1 | 10/2002 | Choi et al. | |
| 6,489,704 B1 | 12/2002 | Kucherov et al. | |
| 6,504,292 B1 | 1/2003 | Choi et al. | |
| 6,515,325 B1 | 2/2003 | Farnworth et al. | |
| 6,517,800 B1 | 2/2003 | Cheng et al. | |
| 6,525,461 B1 | 2/2003 | Iwasaki et al. | |
| 6,562,633 B2 | 5/2003 | Misewich et al. | |
| 2002/0094450 A1 | 7/2002 | Wang et al. | |

(Continued)

OTHER PUBLICATIONS

Article—*The synthesis of metal oxide nanowires by directly heating metal samples in appropriate oxygen atmospheres*, H. Y. Dang, J. Wang, and S. S. Fan, Nanotechnology, 14, 2003, pp. 738-741.

(Continued)

*Primary Examiner*—Timothy Meeks
*Assistant Examiner*—Kelly Stouffer
(74) *Attorney, Agent, or Firm*—Dority & Manning, P.A.

(57) ABSTRACT

The present invention is generally directed to a novel process for the production of nanowires and nanobelts and the novel nanostructures which can be produced according to the disclosed processes. The process can be carried out at ambient pressure and includes locating a metal in a reaction chamber, heating the chamber to a temperature at which the metal becomes molten, and flowing a vapor-phase reactant through the chamber. The vapor-phase reactant and the molten metal can react through a thermal CVD process, and nanostructures can form on the surface of the molten metal. Dimensions of the nanostructures can be controlled by reaction temperature.

37 Claims, 7 Drawing Sheets

U.S. PATENT DOCUMENTS

2002/0172820 A1* 11/2002 Majumdar et al. .......... 428/357
2003/0039602 A1* 2/2003 Sharma et al. .............. 423/349

OTHER PUBLICATIONS

Article—*Synthesis, Raman scattering and defects of β-$Ga_2O_5$ nanorods*, Y. H. Gao, Y. Bando, T. Sato, and Y. F. Zhang, Applied Physics Letters, vol. 81, No. 12, Sep. 16, 2002, pp. 2267-2269.

Article—*General Synthesis of Compound Semiconductor Nanowires*, Xiangfeng Duan and Charles M. Lieber, Adv. Mater., vol. 12, No. 4, 2000, pp. 298-302.

Article—*Direct Synthesis of Gallium Oxide Tubes, Nanowires, and Nanopaintbrushes*, Shashank Sharma and Mahendra K. Sunkara, J. Am. Chem. Soc., 6 pages (A-F).

Article—*Gallium Oxide Nanoribbons and Nanosheets*, Z. R. Dai, Z. W. Pan, and Z. L. Wang, J. Phys. Chem. B, vol. 106, No. 5, 2002, pp. 902-904.

Article—*Block-by-Block Growth of Single-Crystalline Si/SiGe Superlattice Nanowires*, Yiying Wu, Rong Fan, and Piedong Yang, Nano Letters, A-D.

Article—*β-$G_2O_3$ nanowires synthesized from milled GaN powders*, B. C. Kim, K. T. Sun, K. S. Park, K. J. Im, T. Noh, M. Y. Sung and S. Kim, Appl. Phys. Lett., vol. 80, No. 3, Jan. 21, 2002, pp. 479-481.

Article—*Growth and optical characterization of $Ga_2O_3$ nanobelts and nanosheets*, L. Dai, X. L. Chen, X. N. Zhang, A. Z. Jin, T. Zhou, B. Q. Hu and Z. Zhang, J. Appl. Phys., vol. 92, No. 2, Jul. 15, 2002, pp. 1062-1064.

* cited by examiner

THERMAL CVD SYNTHESIS OF NANOSTRUCTURES

BACKGROUND OF THE INVENTION

Nanostructures have found application in many fields including electronics, optoelectronics and catalysis due to their unique physical properties. For instance, low dimensional nanostructures offer enhanced material characteristics due to quantum confinement effects when compared to bulk structures. In addition, these materials offer high surface to volume ratio and a high fraction of chemically similar surface sites. Nanostructures that have been successfully employed in a number of applications include nanotubes, nanowires, nanobelts, nanosheets, nanopaintbrushes and even nanodiskettes.

Nanostructures have been formed via a variety of processes and from several different materials. For instance, carbon nanotubes have been formed and used primarily in the study of thermal, optical and electrical transport phenomena in one-dimensional objects. Nanostructures such as nanowires and nanobelts have also been formed of materials including oxides of zinc, tin, indium, cadmium, magnesium and lead as well as silicon-based materials and carbides for use in a variety of in semi-conducting applications. These materials show promise in other applications also, including probe microscopy tips in sensing applications and interconnects in nanoelectronics.

Nanostructures formed of materials which display unique optical as well as electrical characteristics are being explored for use in the field of optoelectronics. Specifically, gallium-based materials such as gallium oxide and gallium nitride as well as nanomaterials of indium phosphide, gallium phosphide and cadmium sulfide have attracted a great deal of attention due to their unique electronic and luminescence properties.

Processes used to form nanostructures have included, for example, physical evaporation via vapor-liquid-solid (VLS) systems, various catalyst assisted methods, methods involving electric arc gas discharge, and pulsed laser ablation techniques. Such techniques often involve several processing steps as well as requiring the use of expensive catalysts and/or high pressure conditions. Moreover, many of these techniques cannot be accomplished without utilizing expensive and complicated equipment. In addition, such techniques have been utilized with a relatively small number of materials, and generally only used to form homogeneous nanostructures.

The breadth of application for nanostructures could be vastly increased by a simpler, less expensive method of formation. For example, a simpler method of formation could provide a route for formation of novel nanowires and nanobelts formed of materials not utilized before in such structures including novel pristine, hybrid, doped and hetero-structure nanostructures.

SUMMARY OF THE INVENTION

In one embodiment, the present invention is directed to a novel process for the synthesis of nanostructures. In general, the process includes providing a metal to a reaction chamber. The reaction chamber can be heated to a temperature above the melting point of the metal such that the metal becomes molten. A vapor stream carrying a reactant can flow through the heated chamber containing the molten metal. The reactant in the vapor stream can react with the molten metal material through a thermal chemical vapor deposition (CVD) process to form a reaction product. The reaction process can be carried out at ambient pressure. As the reaction product has low solubility and wetting characteristics with respect to the molten metal, a nanostructure comprising the reaction product can form on the surface of the molten metal. The nanostructure can be a nanowire or a nanobelt.

The nanostructure can, in one embodiment, be formed on a suitable substrate such as, for example, silicon, quartz, glass carbon, graphite, pyrolytic boron nitride, alumina or the like.

In one embodiment, the metal used can be a low melting point metal such as, for instance, gallium, indium, zinc, tin or cadmium. When a low melting point metal is used, the temperature in the reaction chamber at which the nanostructures are formed can generally be at least about 200° C. above the melting point of the metal, for instance, about 250° C. above the melting point. In one embodiment, the reaction temperature can be between about 700° C. and about 1500° C. For example, in one embodiment, nanowires can be formed when the reaction chamber is at a temperature between about 700° C. and about 1000° C. while nanobelts of the same material can be formed when the reaction chamber is at a temperature between about 1000° C. and about 1500° C.

As previously mentioned, the reaction product will exhibit low solubility and wetting characteristics with respect to the metal. For instance, the reaction product can have a contact angle with the molten metal of between about 135° and about 180°. In one embodiment, the reaction product can have a contact angle with the molten metal between about 160° and about 180°.

In one embodiment the process can be utilized for forming hetero-nanostructures. For purposes of this disclosure, the term "hetero-nanostructure" is herein defined to be a nanostructure that includes discrete sections and wherein adjacent sections are composed of different materials. In forming a hetero-nanostructure, different reactants can be sequentially fed to the reaction chamber. The reaction product of the molten metal with the first reactant will therefore differ from the reaction product of the same metal with a different reactant. Every reaction product, however, will still have low solubility and wetting characteristics with respect to the molten metal. As each sequential reaction product is formed, it will nucleate to the site of the previously formed material, due to the low solubility and wetting characteristics of the product material, and the growth of the nanostructure will continue, though the material of formation can change with change of reactant. The sequentially formed reaction products can thus form hetero-nanostructures with differing material in discrete sections along the axial length of the structure.

In addition to hetero-nanostructures, the present inventive process may also be used to form pristine (single material) nanostructures from materials not before utilized in nanowires or nanobelts. For example nanowires and nanobelts formed from gallium sulfide, indium sulfide, or tin nitride can be formed. These materials can be used in nanoelectric, optoelectric, or sensing applications such as, for example, semiconducting applications or luminescent sensing devices.

The present invention can also be utilized to form doped or hybrid nanostructures. For purposes of this disclosure, a doped material is herein defined to be a semiconducting material to which an impurity has been added and a hybrid material is defined to be the product material formed when two or more CVD reactions occur simultaneously, the reactions sharing one common metal reactant, the simultaneous reactions forming a single nanostructure. A doped material may, in certain circumstances, also be a hybrid material.

In forming a hybrid structure, two or more reactants with similar affinity for the molten metal may react with the molten metal simultaneously. For example, multiple reactants can be mixed in a single vapor stream or fed simultaneously in two separate vapor streams. Exemplary hybrid materials can include, for example, the simultaneous reaction products of a metal reactant and a vapor stream including two or more reactants selected from the group consisting of hydrogen sulfide, phosphine, arsine, and/or flourine.

In another embodiment, the invention is directed to a process for forming a doped nanostructure. In this embodiment, the vapor stream can include a reactant and a dopant fed to the reaction chamber simultaneously. For example, a reactant and a dopant may be mixed in a single vapor stream or fed simultaneously in two vapor streams. In one embodiment, the dopant material may be a material which has a low reaction affinity for the metal, but, due to the presence of a vapor phase reactant with a higher affinity for the metal, such as oxygen or nitrogen, for instance, the second material will merely dope the reaction product, and will not react with the metal. For example, in one embodiment, the vapor stream can include oxygen and a lower affinity reactant selected from the group consisting of ammonia, hydrogen sulfide, phosphine, arsine and fluorine. In this embodiment, a doped metal oxide nanostructure can be formed. In another embodiment, the vapor stream can include ammonia and a lower affinity reactant selected from the group consisting of hydrogen sulfide, phosphine, arsine, and fluorine. In this embodiment, a doped metal nitride nanostructure can be formed.

In various embodiments, reactants can be selected from the group consisting of oxygen, ammonia, hydrogen sulfide, phosphine, arsine or mixtures thereof. The vapor stream may also include any of a variety of dopants as are generally known in the art which can be incorporated directly into the nanostructure.

BRIEF DESCRIPTION OF THE FIGURES

A full and enabling disclosure of the present invention, including the best mode thereof, to one of ordinary skill in the art, is set forth more particularly in the remainder of the specification, including reference to the accompanying figures in which.

DETAILED DESCRIPTION OF THE INVENTION

Reference will now be made in detail to various embodiments of the invention, one or more examples of which are set forth below. Each embodiment is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used in another embodiment to yield a still further embodiment. Thus, it is intended that the present invention cover such modifications and variations as come within the scope of the appended claims and their equivalents.

In general, the present invention is directed to processes for synthesizing low dimensional nanostructures. The invention is also directed to certain novel nanostructures which can be formed by the disclosed processes. More specifically, according to the processes of the present invention, direct synthesis of nanowires and nanobelts can be carried out at ambient pressure via a thermal chemical-vapor deposition (CVD) process in which a molten metal provides the solvent medium for bulk nucleation and formation of the structures. For purposes of this disclosure, ambient pressure is herein defined to be pressures which one may reasonably expect to encounter in laboratory or manufacturing conditions. That is, atmospheric fluctuations with regard to local conditions (altitude, weather, etc.) are included in the concept of ambient pressure. The presently disclosed processes can be both simpler and more economical than processes utilized in the past. For instance, not only can the process be carried out at ambient pressure, but there is also no need for expensive catalysts. Moreover, expensive, complicated equipment such as lasers, electric arc generators and the like are not required for the process. In addition, the disclosed process is easily scalable and can provide a method for mass production of nanostructures of many different materials.

As the process can be both simple and cost effective, it can provide an economical pathway for forming nanostructures from materials which have not been utilized to form such products in the past. In addition, the process provides a simple, cost-effective method for forming doped nanostructures, hybrid nanostructures, and hetero-nanostructures.

Figure 1:
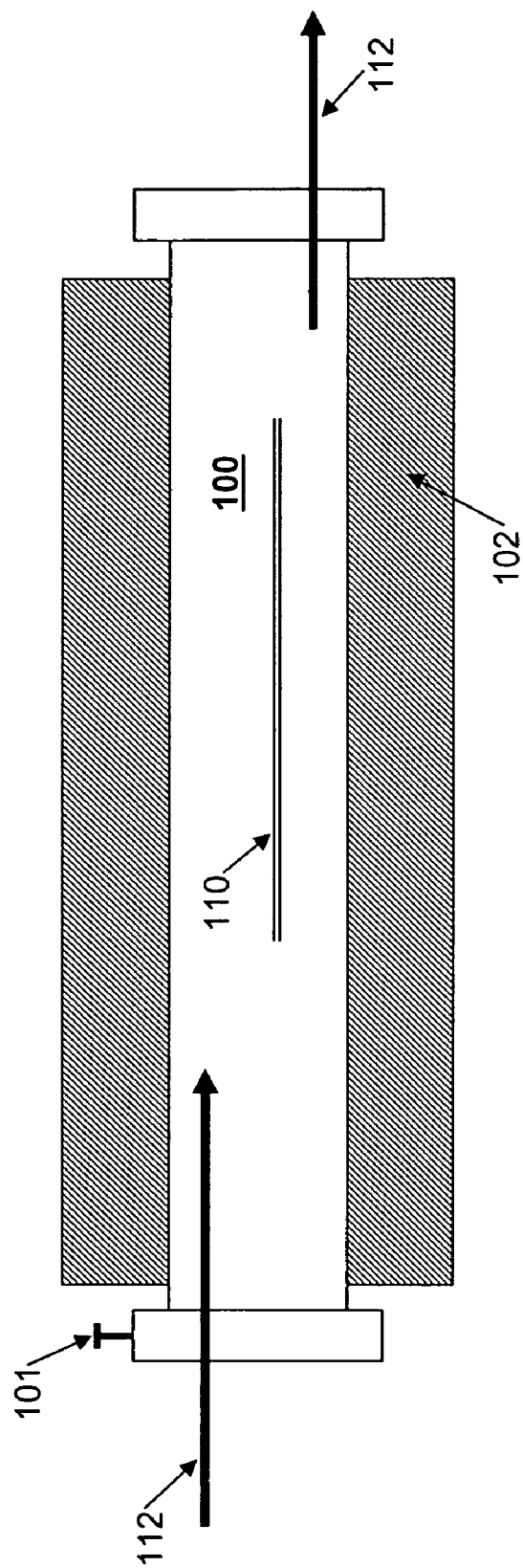
FIG. 1 is a schematic diagram of a reaction chamber for a nanostructure synthesis process according to one embodiment of the present invention.
Figure 2:
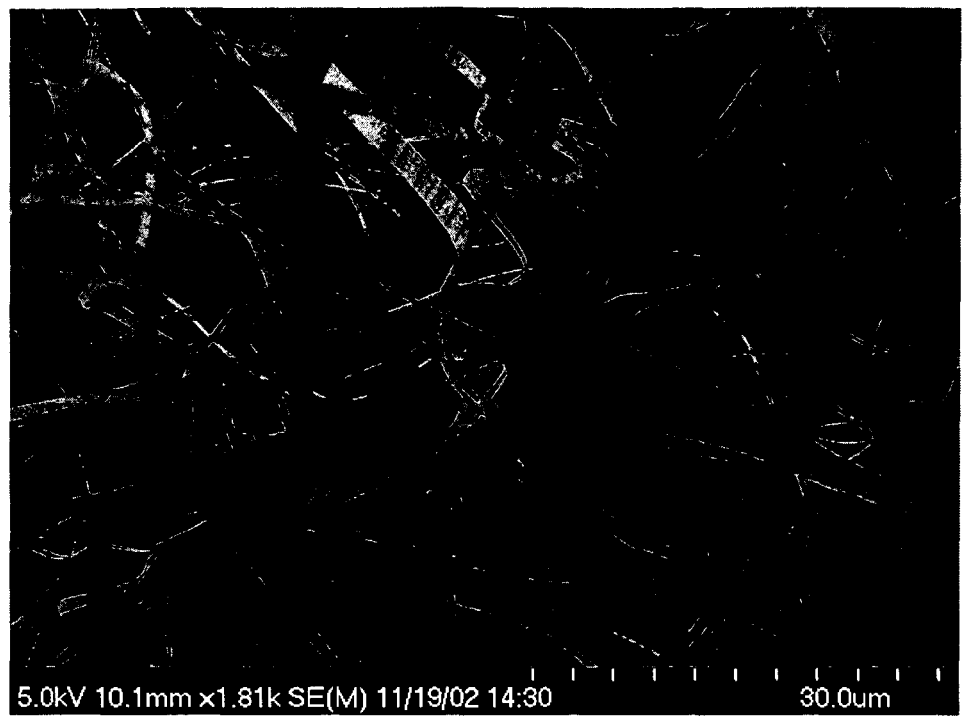
FIG. 2 is a scanning electron micrograph of gallium oxide nanobelts formed according to the process of the present invention.
Figure 3:
FIG. 3 is a scanning electron micrograph of gallium oxide nanowires formed according to the processes of the present invention.
Figure 4:
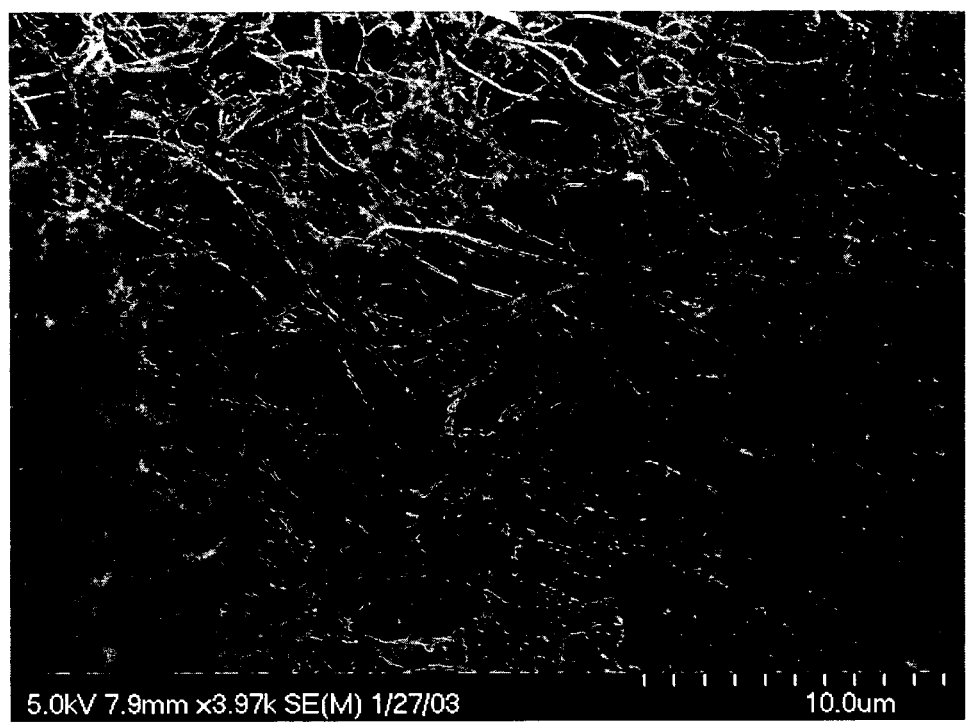
FIG. 4 is a scanning electron micrograph of gallium nitride nanowires formed according to the processes of the present invention.
Figure 5:
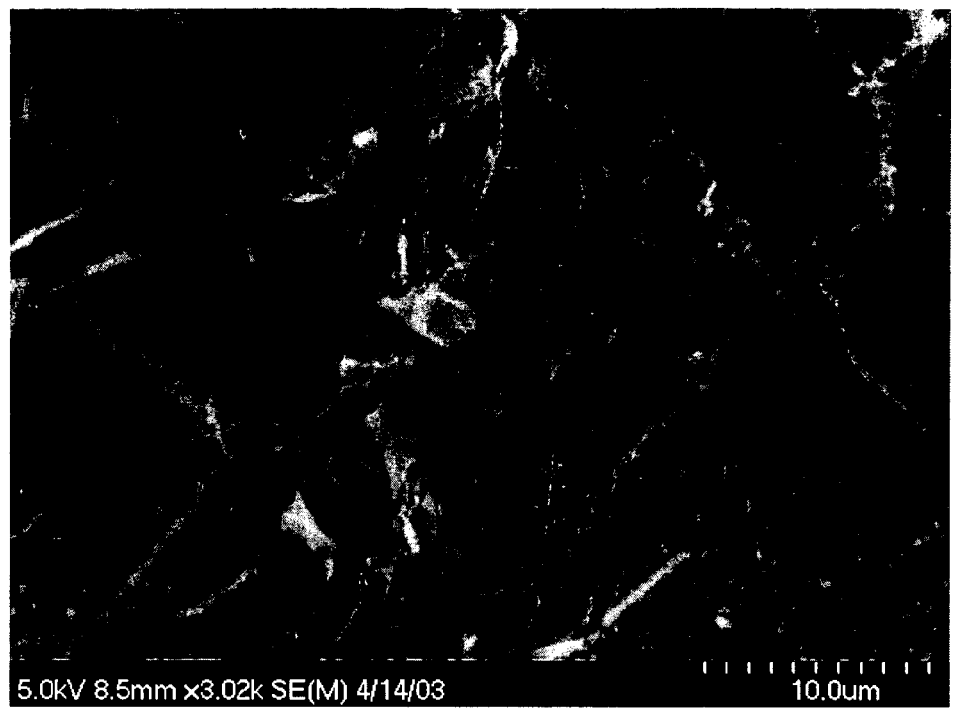
FIG. 5 is a scanning electron micrograph of gallium sulfide nanowires formed according to the processes of the present invention.
Figure 6:
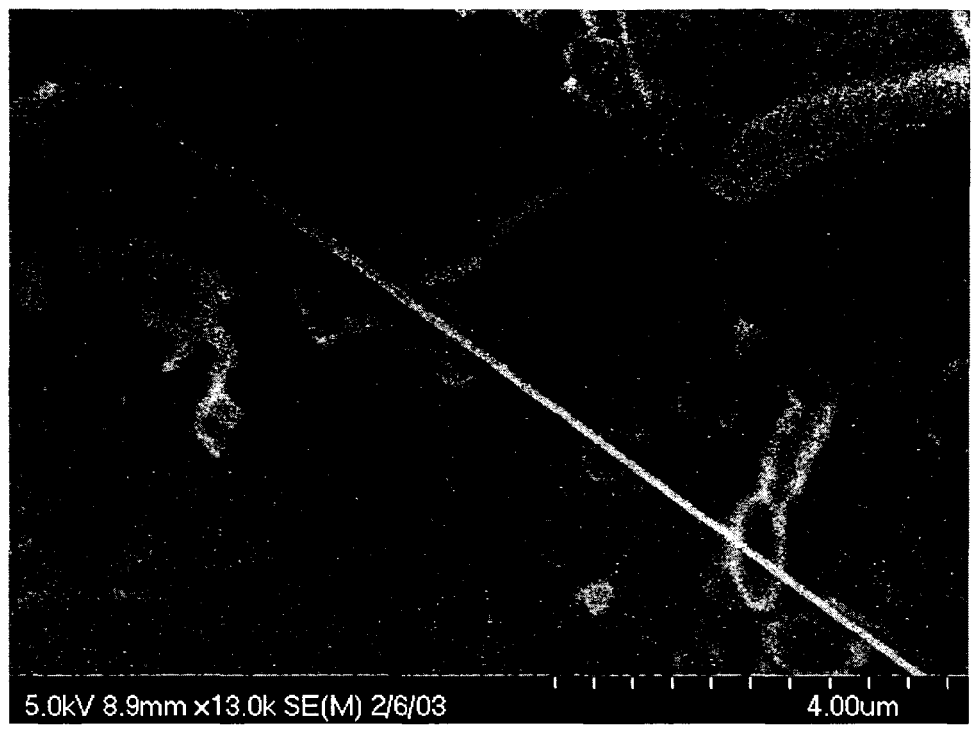
FIG. 6 is a scanning electron micrograph of a single indium oxide nanowire formed according to the processes of the present invention.
Figure 7:
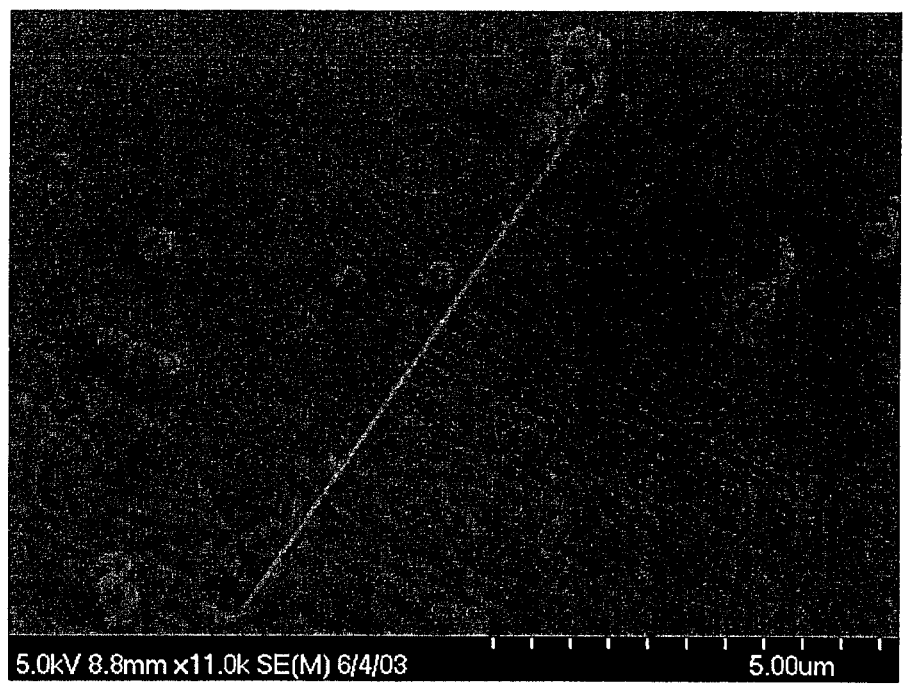
FIG. 7 is a scanning electron micrograph of a single tin oxide nanowire formed according to the process of the present invention.

One embodiment of the CVD process of the present invention is illustrated in FIG. 1. FIG. 1 includes reaction chamber 100 surrounded by a furnace 102. Reaction chamber 100 includes pressure relief valve 101 to maintain ambient pressure in the chamber. Reaction chamber 100 can also include removable substrate 110. In other embodiments, reaction chamber 100 can include multiple substrates 110. Substrate 110 can be of any carrier material known in the art which can hold the molten metal during the formation process and not interfere with the process at the reaction temperatures. For example, substrate 110 can be silicon, quartz, glassy carbon, graphite, pyrolytic boron nitride, alumina or the like. Substrate 110 can be of any convenient size or shape. Alternatively, substrate 110 can be integral to furnace 102 such that the metal is placed directly into the furnace 102 without an additional removable substrate 110 necessary.

A layer of metal can be applied to substrate 110. The metal can usually be at least about 99% pure, preferably at least about 99.5% pure, in order to limit the possibility of any undesired impurities in the products.

The metal can be applied to the removable substrate 110 or directly to a surface of the furnace 102 according to any suitable process. In general, however, the preferred application process for a specific metal can depend upon the form of the metal at ambient temperature and pressure. For example, at ambient temperature and pressure, gallium can be a liquid and thus can be applied to the substrate 110 by a suitable liquid application technique. Alternatively, a metal which is a solid at room temperature, such as tin, for example, can be coated or evaporated on the substrate 110 as a thin film. In one embodiment, a metal layer between about 1 and about 100 microns thick can be laid down, though this is not a requirement of the invention, and, in other embodiments, thicker or thinner layers of metal can be formed.

After the metal layer has been located within reaction chamber 100, the reaction chamber 100 can be heated to a reaction temperature. For instance, furnace 102 can heat reaction chamber 110 to a reaction temperature. In general, the reaction temperature will be somewhat higher than the melting point of the metal, but less than the temperature at which the metal can begin to vaporize.

Preferred reaction temperature can depend on many factors in addition to the physical characteristics of the metal. For instance, the process requires a reaction temperature somewhat higher than the melting point of the metal in order for the process to proceed at all. Variance in reaction temperature can affect kinetics of the process, with higher reaction temperature providing a faster formation process. In addition, reaction temperature can affect the cross sectional shape of the nanostructures formed by the process, as will be further discussed herein. Economics of the process may also be a factor in determining a preferred reaction temperature, as higher reaction temperature can be more expensive to maintain. In this regard, low melting point metals and hence lower reaction temperatures can be preferred in certain embodiments of the invention. For purposes of this disclosure, low melting point metals are defined as metals have a melting point at ambient pressure of less than about 450° C. Low melting point metals include, for example, zinc, gallium, indium, tin, cadmium and mercury.

Generally, in those embodiments utilizing low melting point metals, the reaction chamber should be heated to a temperature at least about 200° C. above the melting point of the metal. For example, the reaction chamber can be heated to a temperature of at least about 250° C. above the melting point of the metal. In one embodiment, the reaction chamber 100 can be heated to a reaction temperature of between about 700° C. and about 1500° C. In one embodiment, the reaction chamber can be heated to a temperature of between about 700° C. and about 1200° C. In certain instances, it may be technically possible to form nanostructures according to a thermal CVD process at lower temperatures. In general, however, when lower temperatures are attempted, closer to the melting point of the metal, in those instances where the nanostructures form at all, a substantial amount of by-products also forms, making the formation process at lower temperatures less attractive due to the unacceptable formation of by-products.

The presently disclosed processes are not limited to low melting point metals, and in other embodiments higher melting point materials can be utilized. For example, higher melting point materials such as germanium, lead, tellurium, aluminum magnesium and the like can be utilized in the invention. When higher melting point metals are used, however, relatively higher reaction temperatures will obviously be required.

Referring again to FIG. 1, as the temperature in reaction chamber 100 approaches the reaction temperature, the metal will melt and a layer of molten metal can form on substrate 110. According to the process, after the chamber 100 reaches the desired reaction temperature, a vapor flow carrying the desired reactants can flow into chamber 100 and can contact the molten metal held on substrate 110. For example, vapor flow 112 can flow through reaction chamber 100 with a flow pattern that allows the vapor phase reactants to contact the molten metal. The vapor flow 112 to the reaction chamber 100 can include either a single or, alternatively, a combination of species which can react with the molten material from the vapor phase via a CVD deposition process and form the reaction products which form the nanostructures. The vapor flow 112 can be supplied to the reaction chamber 100 by any suitable source as is generally known in the art (e.g. pressurized tanks, pumps, etc). In one embodiment, the vapor flow can include oxygen, ammonia, hydrogen sulfide, phosphine, arsine, methane, fluorine, silane or a combination thereof.

In one embodiment, as the vapor flows through the reaction chamber and is heated, the components of the vapor flow may disassociate. For example, hydrogen sulfide can disassociate to form hydrogen gas and sulfur, and it can be only the sulfur which reacts with the molten metal via a thermal CVD process. Similarly, ammonia can disassociate to form hydrogen and nitrogen as the vapor flows through the hot reaction chamber 100, and it can be only the nitrogen which reacts with the molten metal. For purposes of this disclosure, the term 'reactant' can therefore equally refer to the material fed to the reaction chamber (e.g. hydrogen sulfide) as well as to the disassociation products of that reactant material which actually reacts with the molten metal (e.g. sulfur).

The reactants can be supplied to the reaction chamber 100 at any suitable flow rate. For example, in one embodiment, the vapor flow 112 can contain only the reactants and can be supplied to the reaction chamber 100 at between about 300 and about 500 cc/min, although higher or lower flow rates may optionally be utilized. In general, flow rate of the reactants appears to have little or no effect on the rate of formation or final shape of the nanostructures as long as the reactant is readily available for deposition at the molten metal surface.

The vapor flow 112 can include only the reactants or alternatively, can also include a non-reactive carrier species such as argon gas, or a dopant, for example.

The nanostructure is the CVD reaction product of the vapor-phase reactant and the molten metal medium. In order to form the nanostructures, the reaction product of the CVD process should have low solubility and low wetting characteristics with respect to the molten metal. This will encourage the product species to nucleate and "grow" or form the nanostructures up and out of the molten metal. Solubility and wetting characteristics can be assessed by determination of the contact angle between the reaction product and the molten metal. Contact angle can be estimated by use of the equation of state and Young's equation based on the average values of surface energies for the materials, as is generally known in the art. In general, in order to form the nanostructures according to the present invention, the contact angle between the reaction product and the molten metal should be between about 135° and about 180°. In one embodiment, the contact angle can be between about 160° and about 180°.

While not wishing to be bound by any particular theory, it is believed that the developing nanostructures form from the base of the structure as the reaction product nucleates on the surface of the molten metal. Nucleation is due to phase segregation brought about by the low solubility of the reactant product in the molten material. More specifically, the formation process is believed to proceed in stages. First, the vapor phase reactant and the molten metal react by a thermal CVD reaction process to form the reaction product. Due to the low solubility and wetting characteristics of the reaction product with regard to the molten metal, phase segregation is believed to occur causing the reaction product to nucleate on the metal surface. As the CVD reaction process continues, nanostructures can form and push up from the surface of the molten metal layer as reaction product continues to form and segregate to the nuclei on the molten surface, pushing up the previously formed material as product physically combines.

In certain embodiments, the cross-sectional shape of the developing nanostructure can be dependent upon the reaction temperature. For example, when forming nanostructures from low melting point metals, nanowires having diameters between about 10 to 100 nm can form at reaction temperatures between about 700° C. and about 1000° C. At higher reaction temperatures, for example, from about 1000° C. to about 1500° C., the same reactants can form nanobelts having a rectangular cross section.

Nanobelts formed according to the present invention can generally have a width to height ratio of between about 5 and about 30. In one embodiment, nanobelts formed according to the presently disclosed processes can have a width of between about 10 nm and about 100 nm, and a height of between about 50 nm and about 500 nm.

As the formation process is limited only according to the amount of reactant species available, it is believed that extremely long nanostructures of substantially regular dimensions can be formed according to the present processes. For instance, nanobelts and nanowires of a length of several microns can be formed from low melting point metals at a temperature between about 700° C. and about 1500° C. in about 30 to about 60 minutes. Moreover, the disclosed process can form nanostructures with excellent regularity in cross-sectional characteristics along the entire length of the structure, contrary to many previously known processes.

The presently disclosed process can also form the products with a high degree of purity. That is, little or no by-products can be formed by the process in addition to the desired nanostructures. For example, the disclosed process can form nanostructures at about 90% purity or more. In one embodiment, the desired nanostructures can be formed at at least about 95% purity. In another embodiment, the nanostructures can be formed at at least about 98% purity, for example at about 99% purity or more.

In addition to pristine nanostructures, wherein a nanowire or a nanobelt can be formed from the CVD reaction product of a single vapor phase reactant with the molten metal, the present processes can be used to form hybrid, doped, and hetero-nanostructures. Hybrid nanostructures are those structures formed when two or more reactants having similar affinity for the molten metal reactant contact and react with the molten metal simultaneously, both reaction products having low wetting and solubility characteristics in regard to the molten metal. Doped structures are herein defined as those structures in which the CVD reaction product is a semiconductor material, the structure also simultaneously incorporating another dopant component introduced to the reaction chamber in the vapor phase.

In forming a hybrid nanostructure, a mixture of two or more vapor phase reactants can simultaneously contact the molten metal. In these embodiments, the reactants can be fed to the chamber in a single stream or separately, as desired. For example, in one embodiment, a single vapor stream carrying multiple reactants all having similar affinity for the molten metal can be fed to the reaction chamber. In another embodiment, multiple streams, each carrying a single reactant can be fed to the chamber simultaneously.

In order to form hybrid products, the vapor phase reactant materials can have similar reaction affinity for the molten metal such that simultaneous CVD reaction processes can occur and binary, tertiary, quaternary or even higher order systems can be developed, all based on a single metal. For instance, in one embodiment, the vapor phase reactants can include a mixture two or more of any of hydrogen sulfide, phosphine, arsine and/or fluorine. The molten metal can then react with the mixture of reactants in the vapor phase to form a novel hybrid nanostructure.

In other embodiments, two or more reactants can be fed to the reaction chamber, but one of the reactants can have a higher affinity for the molten metal than the other. In this embodiment, that reactant having higher affinity for the molten metal will preferentially react with the molten metal, and the second material can be incorporated into the nanostructure as a dopant. For example, in one embodiment, the vapor flow to the reaction chamber can include oxygen and a second material such as, for example, ammonia, hydrogen sulfide, phosphine, arsine, methane, floourine, or silane. In this embodiment, the product nanostructure can be a doped metal oxide material doped with the second vapor phase material, nitrogen, sulfur, phosphorous, etc. For purposes of this disclosure, the term 'dopant' can refer to the material actually incorporated into the nanostructure or equally can refer to the precursor thereof which can be fed to the reaction chamber.

In another embodiment, a doped metal nitride nanostructure can be formed. In this embodiment, the vapor phase flow can include ammonia and a suitable dopant such as, for example, hydrogen sulfide, phosphine, arsine, methane, floourine, or silane.

The ability to dope semiconductor materials and from hybrid materials can provide a method to fine-tune specific characteristics of the materials. For example, a semiconducting material can be converted to a metallic conducting material via doping. Similarly, the characteristics of other materials, such as can be used in optoelectronic applications, catalysis applications and the like can be very specifically designed through the formation of hybrid or doped materials.

Though not wishing to be bound by any particular theory, it is believed that the relative amount of each vapor phase reactant material in the hybrid and doped nanostructure appears to be primarily dependent upon the relative amounts of the various reactants provided in the vapor phase. For example, a vapor phase reactant flow which provides equal amounts of oxygen and arsenic for thermal CVD reaction with gallium can form a product nanostructure having approximately equal amounts of oxygen and arsenic in the product structure, though individual rates of reaction, relative reactant affinities, as well as other reaction characteristics could also have some effect on the product makeup.

The presently disclosed processes may also be utilized to produce novel hetero-nanostructures. A hetero-nanostructure is a nanostructure including discrete sections of the structure wherein adjacent sections are composed of different materials. For example, a hetero-nanostructure can include a first length formed of reaction product of the molten metal and a first vapor-phase reactant, and an adjacent length formed of the reaction product of the same molten metal, and a different vapor-phase reactant. The hetero-nanostructures of the invention can thus be based upon the same metal throughout the longitudinal length. When the vapor phase reactants are changed, the nanostructures can continue to grow from the previously formed nuclei, new nuclei will not be formed with the change in vapor-phase reactant.

For example, in one embodiment, the nanostructure can include alternating $Ga_2O3/GaN$ sections along the length of the structure. In this embodiment, molten gallium can be located on a substrate in a reaction chamber, and oxygen and ammonia can alternatively flow through the chamber to react sequentially with the gallium and form the hetero-nanostructure.

Obviously, any number of different materials can be included along the axial length of the nanostructure. The only requirements being that the entire length of the structure will be based upon a single metal reactant, and all of the reaction products will exhibit low solubility and wetting characteristics with regard to the molten metal. Any number of different reactants or mixture of reactants may sequentially flow through the reaction chamber to form hetero-nanostructures according to the present invention. Hetero-nanostructures show great potential in a variety of applications including, for example, improved and specifically designed thermoelectric and optoelectric materials such as light emitting sources.

The interface between different materials along the axial length of the presently disclosed hetero-nanostructures can be either abrupt or gradual, as desired. For example, in one embodiment, the junction between two materials in the structure can be well defined and relatively abrupt. In this embodiment, the process may include separation between the flow of the first reactant and the flow of the second reactant. Separation between the sequential reactant flows can include an intervening flow of an inert gas or merely a temporal pause between the cease of the flow of the first vapor-phase reactant prior to the initiation of the flow of the second vapor phase reactant, which can ensure that neither material is significantly doped by or mixed with the other.

Alternatively, the junction between materials of a hetero-nanostructure can be less abrupt, and may include a length of structure in which the first material is gradually replaced by the second material. For instance, the first reactant may flow into the reaction chamber for a period of time, forming a first section of the structure. At some point, the second reactant can be gradually bled into the first vapor stream, such that the nanostructure material in this length is a hybrid or doped material with gradually changing proportions of the reaction product materials. Over a period of time, the concentration of the second reactant in the vapor stream may increase while the concentration of the first reactant is decreased, with the first product material being gradually replaced by the second in the axial direction of the structure.

Due at least in part to the cost-effectiveness and simplicity of the process, a wide variety of materials, including materials not previously utilized in nanostructures, can be utilized to form nanostructures according to the presently disclosed methods. For example, while the presently disclosed process can be used to great advantage to form nanostructures of materials known for such structures, such as metal oxides and the like, the process can also be utilized to form novel pristine, hybrid, doped, and hetero-nanostructures. More specifically, in one embodiment, low melting point molten metals including gallium, zinc, cadmium, tin or indium can be reacted with vapor phase reactants such as oxygen, ammonia, hydrogen sulfide, phosphine, arsine, flourine and the like in various combinations to form novel nanostructures.

In one embodiment, novel pristine nanobelts and nanowires can be formed of gallium sulfide, indium sulfide, or tin nitride. These materials are semiconductors with bandgaps ranging from 2–5 eV and can emit light when excited with visible radiation of appropriate wavelength depending on the material and its bandgap. The disclosed nanostructures of these materials can be utilized in a wide variety of nano-electronic, optoelectronic, catalytic and sensing applications including, for example, lasers, probe microscopy tips and interconnects. Beneficially, these materials can exhibit increasing luminescence yield when formed into nanostructures due to the nature of the nanocrystalline structure. These novel nanostructures can have great utility as small, yet very luminescent materials in devices such as, for example, light emitting diodes and light emitting display devices.

It should be understood that these are exemplary materials only, and nanostructures of a great many materials can be formed according to the present invention, including a great many materials not previously utilized to form such structures. For example, higher melting point metals can be utilized such as aluminum, silver, copper or gold in a higher temperature reaction chamber to form novel metal oxides, metal nitrides, metal sulfides, metal phosphides, metal flourides or metal arsenides. In addition other reactant materials can be utilized to react with the molten metals in the reaction chamber.

The present invention can be better understood by reference to the following example.

EXAMPLE

Thin films of commercially available powders of gallium, indium and tin were evaporated or otherwise coated, depending on the material, on quartz substrates for the synthesis of nanostructures. These substrates were placed inside a tubular quartz reactor (diameter ~1.5") similar to that illustrated in FIG. 1, and heated to a reaction temperature which ranged from 800–1200° C. under a continuous flow of Argon (flow rate of about 100 sccm). At the elevated temperatures, a thin molten metal film formed on the substrate. After the temperature of the reactor was stabilized, the feed gases, which included oxygen, ammonia and hydrogen sulfide were introduced into the reactor at a flow rate of about 400 sccm. The reaction time was about an hour, after which the feed gas was turned off and the reactor was allowed to cool down. Following a cooling period, the substrate was removed from the reactor, and the nanostructures formed on the substrate were examined. Table 1 lists characteristics of specific runs.

TABLE 1

| Run | Metal | Feed Gas | Product | Synthesis temperature |
|---|---|---|---|---|
| 1 | Ga | $O_2$ | $Ga_2O_3$ nanobelts | 1050° C. |
| 2 | Ga | $O_2$ | $Ga_2O_3$ nanowires | 900° C. |
| 3 | Ga | $NH_3$ | GaN | 700–800° C. |
| 4 | Ga | $H_2S$ | $Ga_2S_3$ | 650–800° C. |

TABLE 1-continued

| Run | Metal | Feed Gas | Product | Synthesis temperature |
|---|---|---|---|---|
| 5 | In | $O_2$ | $In_2O_3$ | 1000–1200° C. |
| 6 | In | $H_2S$ | $In_2S_3$ | 700–800° C. |
| 7 | Sn | $O_2$ | $SnO_2$ | 1150–1300° C. |

FIGS. 2–7 are scanning electron micrographs of the products formed in runs 1–5 and run 7, respectively.

It will be appreciated that the foregoing examples, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention which is defined in the following claims and all equivalents thereto. Further, it is recognized that many embodiments can be conceived that do not achieve all of the advantages of some embodiments, yet the absence of a particular advantage shall not be construed to necessarily mean that such an embodiment is outside the scope of the present invention.

What is claimed is:

1. A process for forming a nanostructure comprising:
providing a metal to a reaction chamber, wherein the metal is provided to the reaction chamber as a metal layer formed on a surface;
heating the reaction chamber to a reaction temperature, the reaction temperature being greater than the melting point of the metal such that the metal layer becomes molten, wherein the reaction temperature is between 650° C. and about 1500° C.;
flowing a first vapor stream comprising a first reactant through the reaction chamber; and
reacting the molten metal in the layer with the first reactant at the reaction temperature and ambient pressure via a process consisting of a thermal chemical vapor deposition reaction process to form a first reaction product comprising the metal and the first reactant, wherein the first reaction product exhibits low solubility and low wetting characteristics with respect to the molten metal in the layer; and
forming a nanowire or a nanobelt comprising the first reaction product.

2. The process of claim 1, wherein the metal is a low melting point metal.

3. The process of claim 1, wherein the metal is selected from the group consisting of gallium, indium, zinc, tin and cadmium.

4. The process of claim 1, wherein the reaction temperature is at least about 200° C. above the melting point of the metal.

5. The process of claim 1, wherein the reaction temperature is at least about 250° C. above the melting point of the metal.

6. The process of claim 1, wherein the reaction temperature is between about 700° C. and about 1500° C.

7. The process of claim 1, wherein the reaction temperature is between about 700° C. and about 1200° C., and the nanostructure is a nanowire.

8. The process of claim 1, wherein the reaction temperature is between about 1000° C. and about 1500° C., and the nanostructure is a nanobelt.

9. The process of claim 1, wherein the first reactant is a disassociation product of a material selected from the group consisting of oxygen, ammonia, hydrogen sulfide, phosphine, arsine, and flourine.

10. The process of claim 1, wherein the nanostructure is formed on a substrate selected from the group consisting of silicon, quartz, glass carbon, graphite, pyrolytic boron nitride and alumina.

11. The process of claim 1, further comprising:
ceasing the flow of the first vapor stream;
flowing a second vapor stream through the reaction chamber subsequent to the flow of the first vapor stream, wherein the second vapor stream comprises a second reactant, different than the first reactant; and
reacting the molten metal in the layer with the second reactant via a thermal chemical vapor deposition process at ambient pressure, wherein the reaction product of the molten metal and the second reactant comprises the metal and the second reactant and exhibits low solubility and wetting characteristics with respect to the molten metal in the layer, the nanostructure further comprising the reaction product of the molten metal and the second reactant.

12. The process of claim 11, wherein the second reactant is a disassociation product of a material selected from the group consisting of oxygen, ammonia, hydrogen sulfide, phosphine, arsine, and fluorine.

13. The process of claim 11, further comprising flowing an inert gas through the reaction chamber subsequent to the flow of the first vapor stream and prior to the flow of the second vapor stream.

14. The process of claim 1, wherein the reaction product is a semiconductor material, the vapor stream further comprising a dopant, the nanostructure comprising a doped semiconductor material.

15. A process for forming a hybrid nanostructure comprising:
providing a metal to a reaction chamber, wherein the metal is provided to the reaction chamber as a metal layer formed on a surface;
heating the reaction chamber to a reaction temperature, the reaction temperature being greater than the melting point of the metal such that the metal becomes molten, wherein the reaction temperature is between 650° C. and about 1500° C.;
flowing a vapor stream through the reaction chamber, the vapor stream comprising two or more reactants including a first reactant and a second reactant, wherein the two or more reactants have similar affinity for the molten metal;
reacting the molten metal in the layer with the two or more reactants simultaneously at ambient pressure via a process consisting of a thermal chemical vapor deposition reaction process to form two or more reaction products including a first reaction product and a second reaction product, the first reaction product comprising the first reactant and the metal and the second reaction product comprising the second reactant and the metal , the first and second reaction products exhibiting low solubility and low wetting characteristics with respect to the molten metal; and
forming a nanowire or a nanobelt comprising a hybrid of the two or more reaction products.

16. The process of claim 15, wherein the metal is selected from the group consisting of gallium, indium, zinc, tin and cadmium.

17. The process of claim 16, wherein the reaction temperature is at least about 200° C. above the melting point of the metal.

18. The process of claim 15, wherein the first reactant and the second reactant are disassociation products of a first material and a second material independently selected from the group consisting of hydrogen sulfide, phosphine, arsine, and fluorine.

19. The process of claim 15, wherein the reaction temperature is between about 700° C. and about 1500° C.

20. The process of claim 15, wherein the reaction temperature is between about 700° C. and about 1200° C., and the nanostructure is a nanowire.

21. The process of claim 15, wherein the reaction temperature is between about 1000° C. and about 1500° C., and the nanostructure is a nanobelt.

22. A process for forming a hetero-nanostructure comprising:
providing a metal to a reaction chamber, wherein the metal is provided to the reaction chamber as a metal layer formed on a surface;
heating the reaction chamber to a reaction temperature, the reaction temperature being greater than the melting point of the metal such that the metal becomes molten, wherein the reaction temperature is between 650° C. and about 1500° C.;
flowing a first vapor stream comprising a first reactant through the reaction chamber;
reacting the molten metal in the metal layer with the first reactant at ambient pressure via a process consisting of a thermal chemical vapor deposition reaction process wherein the first reaction product thus obtained exhibits low solubility and low wetting characteristics with respect to the molten metal, the first reaction product comprising the first reactant and the metal;
forming a first length of a nanowire or a nanobelt comprising the first reaction product;
flowing a second vapor stream through the reaction chamber subsequent to the flow of the first vapor stream, wherein the second vapor stream comprises a second reactant different from the first reactant;
reacting the second reactant with the metal in the metal layer at ambient pressure via a process consisting of a thermal chemical vapor deposition process, wherein the second reaction product thus obtained exhibits low solubility and low wetting characteristics with respect to the molten metal, the second reaction product comprising the second reactant and the metal; and
forming a second length of the nanostructure adjacent the first length, the second length comprising the second reaction product.

23. The process of claim 22, wherein the metal is a low melting point metal.

24. The process of claim 22, wherein the reaction temperature is at least about 200° C. above the melting point of the metal.

25. The process of claim 22, wherein the reaction temperature is between about 700° C. and about 1500° C.

26. The process of claim 22, wherein the reaction temperature is between about 700° C. and about 1200° C., and the nanostructure is a nanowire.

27. The process of claim 22, wherein the temperature is between about 1000° C. and about 1500° C., and the nanostructure is a nanobelt.

28. The process of claim 22, wherein the first reactant and the second reactant are disassociation products of materials independently selected from the group consisting of oxygen, ammonia, hydrogen sulfide, phosphine, arsine, and flourine.

29. The process of claim 22, further comprising flowing an inert gas through the reaction chamber subsequent to flowing the first vapor stream through the reaction chamber and prior to flowing the second vapor stream through the reaction chamber.

30. A process for forming a doped nanostructure comprising:
providing a metal to a reaction chamber, wherein the metal is provided to the reaction chamber as a metal layer formed on a surface;
heating the reaction chamber to a reaction temperature, the reaction temperature being greater than the melting point of the metal such that the metal becomes molten, wherein the reaction temperature is between 650° C. and about 1500° C.;
flowing a vapor stream comprising a reactant and a dopant through the reaction chamber; and
reacting the molten metal in the metal layer with the reactant at ambient pressure via a process consisting of a thermal chemical vapor deposition reaction process to form a first reaction product comprising the reactant and the metal, wherein the first reaction product exhibits low solubility and low wetting characteristics with respect to the molten metal; and
forming a nanowire or a nanobelt comprising the first reaction product and the dopant.

31. The process of claim 30, wherein the metal is selected from the group consisting of gallium, indium, zinc, tin and cadmium.

32. The process of claim 30, wherein the reaction temperature is at least about 200° C. above the melting point of the metal.

33. The process of claim 30, wherein the reaction temperature is between about 700° C. and about 1500° C.

34. The process of claim 30, wherein the reaction temperature is between about 700° C. and about 1200° C., and the nanostructure is a nanowire.

35. The process of claim 30, wherein the temperature is between about 1000° C. and about 1500° C., and the nanostructure is a nanobelt.

36. The process of claim 30, wherein the reactant is oxygen and the dopant is the disassociation product of a material selected from the group consisting of ammonia, hydrogen sulfide, phosphine, arsine, and flourine.

37. The process of claim 30, wherein the reactant is nitrogen and the dopant is a disassociation product of a material selected from the group consisting of hydrogen sulfide, phosphine, arsine, and fluorine.

* * * * *